United States Patent [19]

Jouffrey et al.

[11] Patent Number: 4,516,026
[45] Date of Patent: May 7, 1985

[54] SCANNING ELECTRON MICROSCOPE ASSEMBLY OPERATING IN SITU

[75] Inventors: Bernard Jouffrey; Jacques Trinquier, both of Toulouse; Jean-Luc Franceschi, Castanet-Tolosan, all of France

[73] Assignee: Centre National de la Recherche Scientifique CNRS, Paris, France

[21] Appl. No.: 432,918
[22] PCT Filed: Feb. 2, 1982
[86] PCT No.: PCT/FR82/00021
 § 371 Date: Sep. 27, 1982
 § 102(e) Date: Sep. 27, 1982
[87] PCT Pub. No.: WO82/02796
 PCT Pub. Date: Aug. 19, 1982

[30] Foreign Application Priority Data

Feb. 4, 1981 [FR] France .................. 81 02152

[51] Int. Cl.³ .................. H01J 37/18; H01J 37/20; H01J 37/26
[52] U.S. Cl. .................. 250/310
[58] Field of Search .................. 250/310

[56] References Cited

U.S. PATENT DOCUMENTS 3,346,736 10/1967 Neuhaus .................. 250/310

FOREIGN PATENT DOCUMENTS 1367468 6/1964 France .
1480912 4/1967 France .
2046833 3/1971 France .

OTHER PUBLICATIONS

Patent Abstracts of Japan, Sep. 5, 1981, vol. 5, No. 141.

*Primary Examiner*—Alfred E. Smith
*Assistant Examiner*—Jack I. Berman
*Attorney, Agent, or Firm*—Cushman, Darby & Cushman

[57] ABSTRACT

A transportable scanning microscope assembly operating in situ comprises a light microscope column (1) which may be directly disposed on the object to be examined (19) through a supporting structure (16) withstanding pressure and defining an internal chamber (4) the lower aperture of which is limited by peripheral resilient sealing (17) intended to be disposed in abutment on the surface (19'), the chamber (4) being connected (21) to a transportable pumping device (4). In order to allow an angular range (A) of the surface (19') to be covered by the optical axis (15), the column (1) is mounted on the support (16) by means of a knee-joint (22) sealed by a metallic diaphragm (23). The invention is particularly useful in the checking of aircraft wings and mirrors.

7 Claims, 1 Drawing Figure

U.S. Patent May 7, 1985 4,516,026
Fig: 1
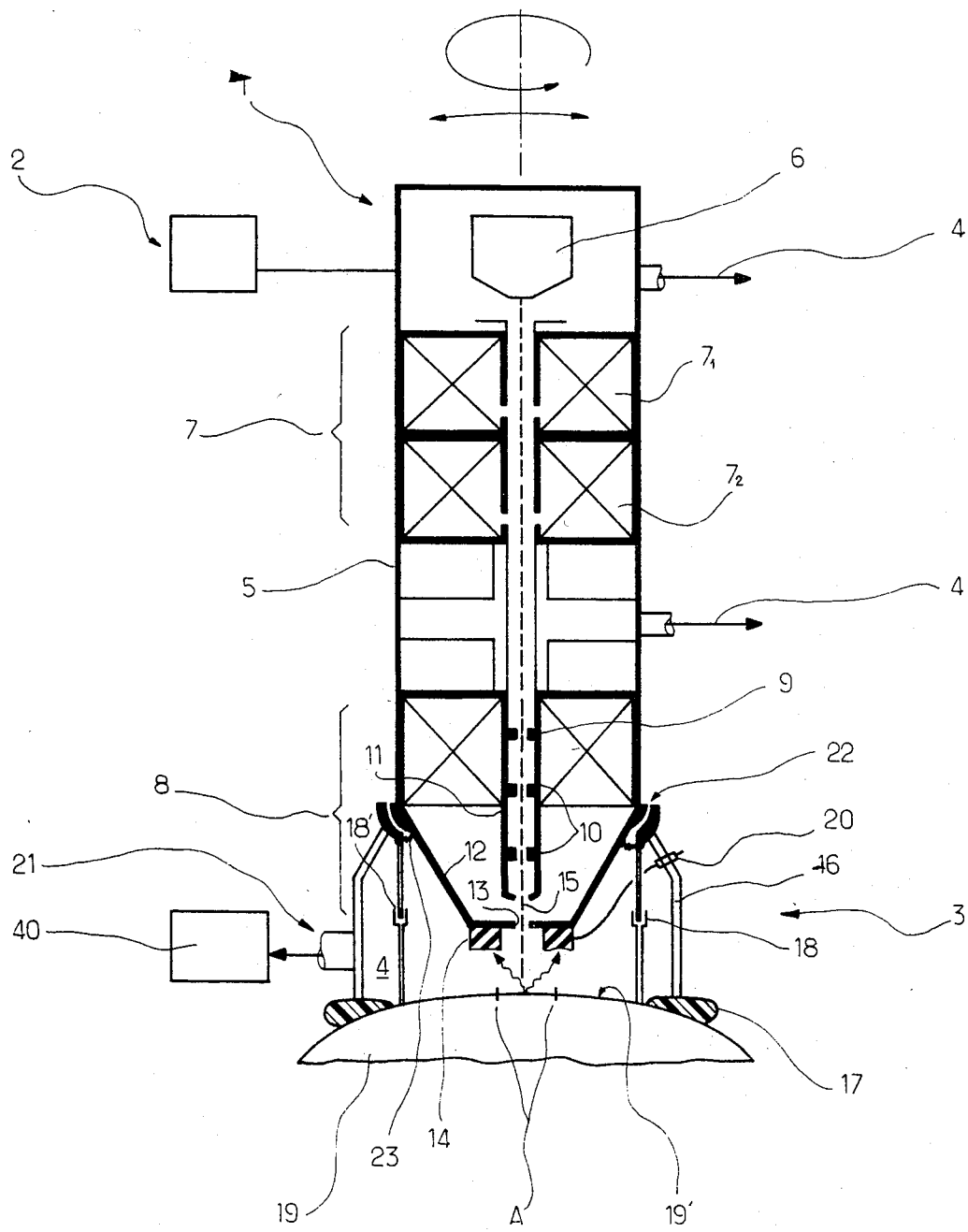

SCANNING ELECTRON MICROSCOPE ASSEMBLY OPERATING IN SITU

The present invention concerns scanning electron microscopes and, more particularly, a scanning electron microscope operating in situ.

The use of scanning electron microscope has undergone tremendous development due to their pliancy in use, notably in association with visualization cathodic screens, and to their extremely convenient performances in observation, notably concerning depth of field. These characteristics make particularly advantageous industrial use of scanning electron microscopes to check the surfaces of operational or structural elements, notably for checking manufacturing processes or the study of surface bucklings upon stress tests. To the present, the study of such surfaces has been made by conventional optical processes using magnifying glasses or optical microscopes with slight magnification and limited depth of field. Thus, it appears particularly inviting to use, for said checkings, scanning electron microscopes in view of the aforesaid stated advantages. However, as known in electron microscopy, it is required to introduce the object to be observed on a special support to place it in a vacuum plenum forming an observation chamber for the microscope. Thus, the use of electron microscopes required destructive preparation techniques requiring the taking of a sample to be placed within the observation chamber at the price of damage or buckling of the portion to be studied.

In order to obviate this disadvantage, it has been proposed to use an electron microscope observation technique using an intermediary vacuum plenum having slight sizes and connected to a powerful pumping device clearing at right angles to the portion to be observed by a diaphragm having a minute opening (of the order of 30 microns) and a slight thickness, so as to limit the air leak output to be permanently balanced by the pumping device. The so proposed technique has a number of limitations, notably into account the very limited observation field, due to the microscopical size of the diaphragm, the non-homogeneity of the vacuum at the level of the optical axis and the diffusion of the electrons which are retrodiffused by the object resulting in images of a poor grade.

The object of the present invention is to obviate these disadvantages by providing a scanning electron microscope assembly operating in situ, having a light and transportable structure, which may be directly laid on the object to be examined without any particular preparation of the latter while allowing a direct observation of the related object in the natural environment thereof, and enabling high magnification with an excellent depth of field (for instance, on the order of a thousand times greater than with an optical microscope) to be obtained for a quick, adaptable and non-destructive study in situ of, for example, aircraft wings, or for the checking of parts which are either machine-finished or worked with precision, such as glass lenses and mirrors for optical systems.

The scanning electron microscope assembly operating in situ, comprising a column unitary electron microscope, connection means to a system for controlling and checking the microscope and to a pumping system, comprises a supporting means for the column, connected to the lower part thereof, and an interior chamber having a lower open portion intended to be disposed tightly on a peripheral surface integral to the portion to be observed, means being provided for communicating the internal chamber with a transportable pumping system.

The support means comprises a peripheral skirt or wall withstanding pressure and defining the internal chamber and flexible sealing means limiting the lower open portion of the chamber, and intended to be applied on the bearing surface to be observed.

Other features and advantages of the present invention will appear from the following description of an embodiment, given by way of illustration but in any case not limiting, made in relation to the accompanying drawing in which:

The sole FIGURE is a diagramatic view of the scanning electron microscope assembly operating in situ according to the present invention, disposed in sealing abutment on the surface to be observed.

As shown in FIGURE 1, the scanning electron microscope assembly operating in situ according to the invention essentially comprises an electron microscope column 1 having a slight size and reduced weight, connected to an electronic checking and controlling system 2, a supporting means for column 3 defining an internal chamber 4, connected, as well as column 1, to a portable powerful pumping device 40. More specifically, column 1 comprises a tight tubular frame 5 including successively an electron gun 6, a stage 7 of two capacitors $7_1$ and $7_2$, and an objective lens stage 8 with a stigmator 9 and scanning coils 10 within a tubular conduct 11 extending close to the bottom of the frusto-conical hood 12 converging downwardly, closing the column 1, and provided with a central aperture 13 for the passage of the electron beam about which is disposed the annular electron detector 14 concentric to the optical axis 15 of column 1.

According to the present invention, the support means 3 of column 1 comprises a peripheral wall or skirt 16 having a resisting shape (withstanding pressure, for instance) a hub made of stainless steel, defining the internal chamber 4, in which is protruding the lower frusto-conical hood 12, and on the edge of the open end of which is secured a peripheral resilient sealing 17 (for instance, an elastomeric material which is solid or selectively) inflatable. This supporting means further comprises a vertically adjusting system (or jacks 18,18'), enabling the distance between the detector 14 and the portion to be observed A of the surface 19' of the body 19 to be studied, to be adjusted with precision on a determined range. A connector 20, which is mounted on wall 16, enables the detector 14 to be connected to the control and checking system 2. The wall 16 further comprises, on the sides thereof, a sleeve 21 for connection to the pumping device 4.

In a particular embodiment, to allow an angular displacement of the column 1 and to cover a broader observation surface A, the column 1 is connected to the top end of the supporting wall 16 by a knee-joint system 22 (for instance, having cooperating toric surfaces made of teflon) the tightness at the level of the knee-joint 22 being insured by a flexible diaphragm 23 made of a metallic alloy known under the name "Tombac" sealingly connecting the upper portion of the wall 16 to an adjacent crown of the frusto-conical hood 12.

Therefore, it will be understood that for observation in situ, the microscope column 1 together with the support thereof 16 is transferred perpendicularly to the portion A to be studied, the assembly coming in abutment on the part 19 to be studied by the flexible sealing 17, the application of a vacuum within the internal chamber 4 of the supporting means by the pumping device 14 ensuring therein the vacuum grade (about $10^{-4}$ mm of mercury) required for operating the microscope while further placing perfectly sealing 17 on the surface 19', thus ensuring tightness during the time required for the observation. This device thus enables aircraft wings or any surfaces to be studied in situ with a resolution power ranging from 10 to 20 nanometers.

The microscope column 1 having a height of about 50 centimeters, is, for example, of the MIEL bis type which has been conceived by the electron optical laboratory of the CNRS in Toulouse, operating under a low voltage ranging from 10 to 15 kilowatts.

Although the present invention has been described in relation with particular embodiments, it is not thereby limited, but is capable of modifications which will appear to those skilled in the art. In particular, for the observation of details on limited surface areas, the wall 16 of the supported means may be radially extended inwardly by a crown, itself ended by a sealing joint 17, to limit the aperture of the internal chamber 4.

What is claimed is:

1. A scanning electron microscope assembly adapted to operate in situ comprising:
   a column unitary microscope having a base and connection means adapted for connecting said microscope to a control and checking system and to a pumping system;
   supporting means, connected to a lower part of the column, for supporting said column and for defining an internal chamber having a lower open portion adapted to be disposed in tight abutment with a surface integral to a portion of said surface to be observed;
   sleeve means for communicating said internal chamber to said pumping system; and
   adjusting means for adjusting the distance between a lower end of said column and said surface to be observed.

2. An assembly according to claim 1, wherein said supporting means comprises a peripheral wall for withstanding pressure and defining the internal chamber, and a flexible means for limiting a lower portion of said chamber.

3. An assembly according to claim 2, wherein said flexible means comprises a peripheral resilient sealing means.

4. An assembly according to claim 1, further comprising an annular detector of electrons mounted at a frustoconical lower end of said column, which protrudes into said internal chamber.

5. An assembly according to claim 3, wherein said peripheral resilient sealing means is comprised of an elastomeric material.

6. A scanning electron microscope assembly adapted to operate in situ comprising:
   a column unitary microscope having a base and connection means adapted for connecting said microscope to a control and checking system and to a pumping system;
   supporting means, connected to a lower part of the column, for supporting said column and for defining an internal chamber having a lower open portion adapted to be disposed in tight abutment with a surface integral to a portion of said surface to be observed;
   sleeve means for communicating said internal chamber to said pumping system;
   adjusting means for adjusting the distance between a lower end of said column and said surface to be observed;
   a peripheral wall formed by a shape-holding skirt and connected by an articulation member to the base of said column; and
   a tight flexible diaphragm, made of metallic alloy, connecting an upper part of said skirt to the base of said column; wherein
   said supporting means comprises a peripheral wall for withstanding pressure and defining the internal chamber, and a flexible means for limiting a lower portion of said chamber; and wherein
   said flexible means comprises a peripheral resilient sealing means.

7. A scanning electron microscope assembly adapted to operate in situ comprising:
   a column unitary microscope having a base and connection means adapted for connecting said microscope to a control and checking system and to a pumping system;
   supporting means, connected to a lower part of the column, for supporting said column and for defining an internal chamber having a lower open portion adapted to be disposed in tight abutment with a surface integral to a portion to be observed;
   sleeve means for communicating and internal chamber to said pumping system;
   adjusting means for adjusting the distance between a lower end of said column and said surface to be observed;
   a peripheral wall formed by a shape-holding skirt and connected by an articulation member to the base of said column; and
   a tight flexible diaphragm connecting an upper part of said skirt to the base of said column; wherein
   said supporting means comprises a peripheral wall for withstanding pressure and defining the internal chamber, and a flexible means for limiting a lower portion of said chamber; and wherein
   said flexible means comprises a peripheral resilient sealing means.

* * * * *